United States Patent [19]

Hester et al.

[11] Patent Number: 4,827,222

[45] Date of Patent: May 2, 1989

[54] INPUT OFFSET VOLTAGE TRIMMING NETWORK AND METHOD

[75] Inventors: Richard E. Hester; Tuan V. Ngo, both of Eden Prairie, Minn.

[73] Assignee: VTC Incorporated, Bloomington, Minn.

[21] Appl. No.: 131,804

[22] Filed: Dec. 11, 1987

[51] Int. Cl.[4] .............................................. H04F 3/45
[52] U.S. Cl. ..................................... 330/257; 330/261
[58] Field of Search ................................ 330/257, 261

[56] References Cited

U.S. PATENT DOCUMENTS

| | | | |
|---|---|---|---|
| 3,388,461 | 6/1968 | Lins | 29/610 |
| 4,031,272 | 6/1977 | Khanna | 427/96 |
| 4,138,671 | 2/1979 | Comer et al. | 340/347 |
| 4,147,971 | 4/1979 | Price | 330/261 X |
| 4,150,366 | 4/1979 | Price | 340/166 R |
| 4,210,996 | 7/1980 | Amemiya et al. | 29/610 R |
| 4,215,333 | 7/1980 | Huang | 338/322 |
| 4,240,094 | 12/1980 | Mader | 219/121 LH |
| 4,278,706 | 7/1981 | Barry | 427/96 |
| 4,306,246 | 12/1981 | Davies et al. | 357/36 |
| 4,344,064 | 8/1982 | Bitler et al. | 338/334 |
| 4,381,441 | 4/1983 | Desmarais et al. | 219/121 LJ |
| 4,412,241 | 10/1983 | Nelson | 357/51 |
| 4,456,894 | 6/1984 | Lapart | 333/22 R |
| 4,459,580 | 7/1984 | Furukawa | 340/347 |
| 4,468,652 | 8/1984 | Wang et al. | 340/347 |
| 4,539,622 | 9/1985 | Akasaki | 361/401 |
| 4,565,000 | 1/1986 | Brokaw | 29/611 |
| 4,580,030 | 4/1986 | Takeuchi | 219/111 LJ |
| 4,586,019 | 4/1986 | Brokaw | 338/195 |

OTHER PUBLICATIONS

Faber, "Algorithmic Trimming on Active Circuitry," Proceedings 1974, 24th Electronic Components Conference, pp. 248-254.

Primary Examiner—James B. Mullins
Attorney, Agent, or Firm—Kinney & Lange

[57] ABSTRACT

Trimming of input offset voltage of a diferential amplifier is provided by a pair of resistance networks which are connected to the emitters of a pair of current mirror transistors. By adjusting the resistances of the resistance networks, the adjustment currents flowing through the current mirror transistors are selected to cancel out the input offset voltage of the differential amplifier. Each resistance network includes a plurality of resistors connected in series with a low resistance shorting link connected in parallel with each of the plurality of resistances. The input offset voltage is trimmed by selectively cutting the shorting links with a two-phase measure and trim process.

8 Claims, 2 Drawing Sheets

INPUT OFFSET VOLTAGE TRIMMING NETWORK AND METHOD

BACKGROUND OF THE INVENTION

1. Field of the Invention.

The present invention relates to amplifier circuits. In particular, the present invention is a circuit and method for input offset voltage trimming an input stage of an integrated circuit amplifier.

2. Description of the Prior Art.

In an integrated circuit operational amplifier, the input stage typically is a differential amplifier formed by a differential pair of transistors. Typically, the differential amplifier input stage exhibits an offset voltage of a random magnitude and polarity, which results in different output currents from the differential amplifier input stage when input voltages at the two input terminals are equal.

In order to make the output currents equal when the input voltages are equal, some form of input offset voltage trimming using adjustable resistors can be performed. Laser trimming of resistance networks on an integrated circuit chip is one approach which has been used in prior art input offset voltage trimming. The prior art techniques, however, typically require a large total resistance value (for example 500K-2000K ohms), which occupies a large portion of the chip area. These prior art trimming schemes, despite using large total resistor values, have typically covered only a small trimming range (about 0.5 mv-1 mv). In addition, laser trimming can affect the temperature coefficient of the offset voltage VOS, which results in poor long term stability of the amplifier circuit characteristics.

SUMMARY OF THE INVENTION

The present invention is an improved input offset voltage trimming method which uses a pair of resistance ladder networks connected to a pair of current mirror transistors. By changing total resistance of the networks, the respective currents drawn by the current mirror transistors can be adjusted in order to make the output currents of the differential amplifier equal when the input voltages are equal.

With the present invention, each resistance ladder network includes a plurality of resistances connected in series, with a shorting link connected in parallel with each resistance. Trimming is accomplished by a measure-and-trim technique which preferably includes two phases.

During the first phase of trimming comparable links of each resistance ladder network are cut until the absolute value of the input offset voltage meets a predetermined criteria. This narrows the trimming range so that only a small change in total resistance in one of the ladder networks will produce a large amount of offset adjustment during the second phase of trimming.

During the second phase, only a link in one of the ladder networks is cut, depending on the polarity of the offset voltage and a calculated expected adjustment achieved by cutting that particular link.

With the trimming method of the present invention, a large trimming range can be achieved with a much smaller total resistance. By trimming or cutting links instead of trimming the resistors themselves, VOS drift over temperature and time is minimized.

DETAILED DESCRIPTION OF THE PREFERRED EMBODIMENTS

Figure 1:
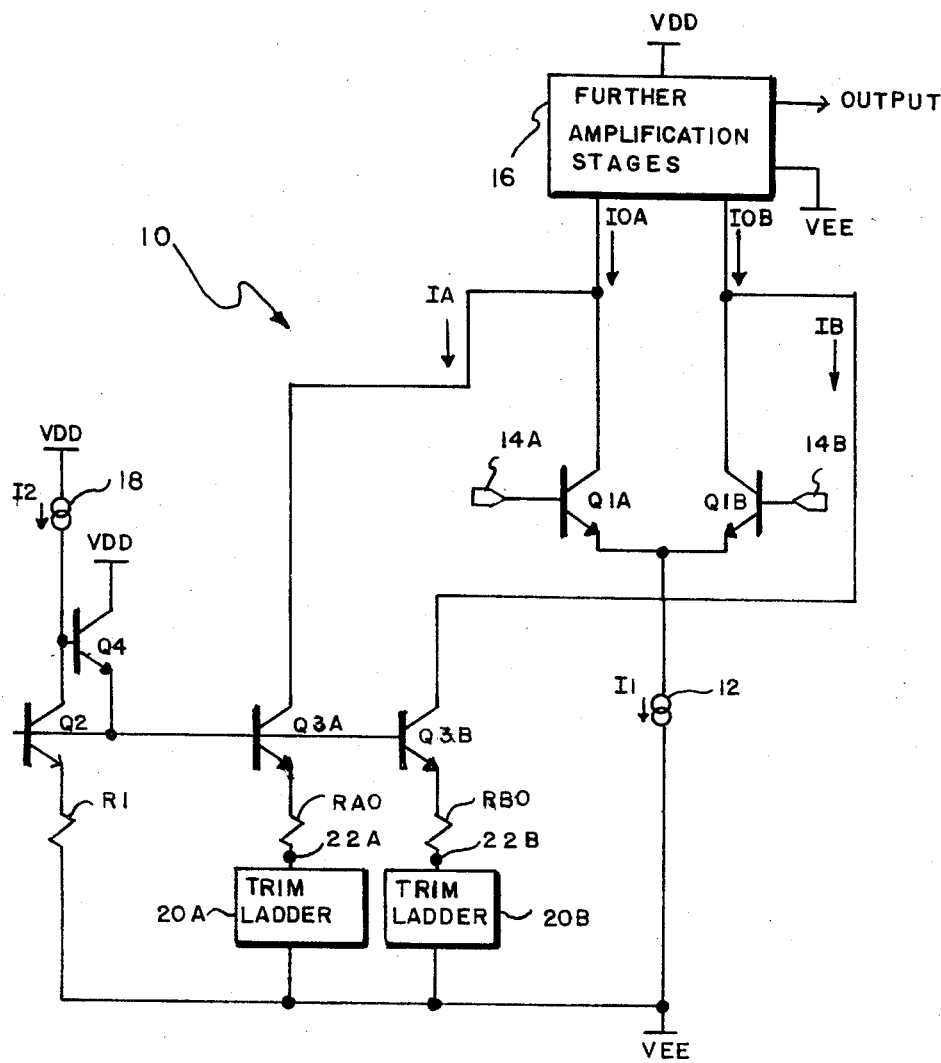
FIG. 1 is an electrical schematic diagram showing a portion of a differential amplifier input stage with the offset trimming circuitry of the present invention.

In FIG. 1 it shows a portion of an integrated circuit amplifier 10 which includes a differential input stage formed by NPN transistors Q1A and Q1B and current source 12. Transistors Q1A and Q1B have their bases connected to input terminals 14A and 14B, respectively. The emitters of transistors Q1A and Q1B are connected together to current source 12, which produces a current I1 which, in a preferred embodiment, is 240 microamps.

The outputs of the differential amplifier stage formed by transistors Q1A and Q1B are output currents IOA and IOB. These currents control further amplification stages 16 to produce an amplified output signal.

The remaining circuitry shown in FIG. 1 adjusts currents IOA and IOB so that when the voltages at inputs 14A and 14B are exactly equal, currents IOA and IOB will be exactly equal.

NPN transistors Q2, Q3A, and Q3B are connected in a current mirror circuit to produce adjustment currents IA and IB to cancel out offsets so that IOA and IOB are equal when the voltages at input terminals 14A and 14B are equal. The collector of transistor Q3A is connected to the collector of transistor Q1A, and the collector of transistor Q3B is connected to the collector of transistor Q1B. The bases of transistors Q2, Q3A and Q3B are connected together. Base current is supplied to the bases of transistors Q2, Q3A and Q3B by beta helper transistor Q4. Current source 18 provides a current I2 to the collector of transistor Q2 and the base of transistor Q4. In one preferred embodiment, current I2 is 120 microamps, and maintains a predetermined relationship to current I1 despite variations in temperature or supply voltages.

The emitter of transistor Q2 is connected through resistor R1 to voltage rail VEE. The emitter of transistor Q3A is connected through fixed resistance RA0 and trim resistor ladder 20A to rail VEE. Similarly, the emitter of transistor Q3B is connected through fixed resistor RB0 and trim resistor ladder 20B to rail VEE.

Figure 2:
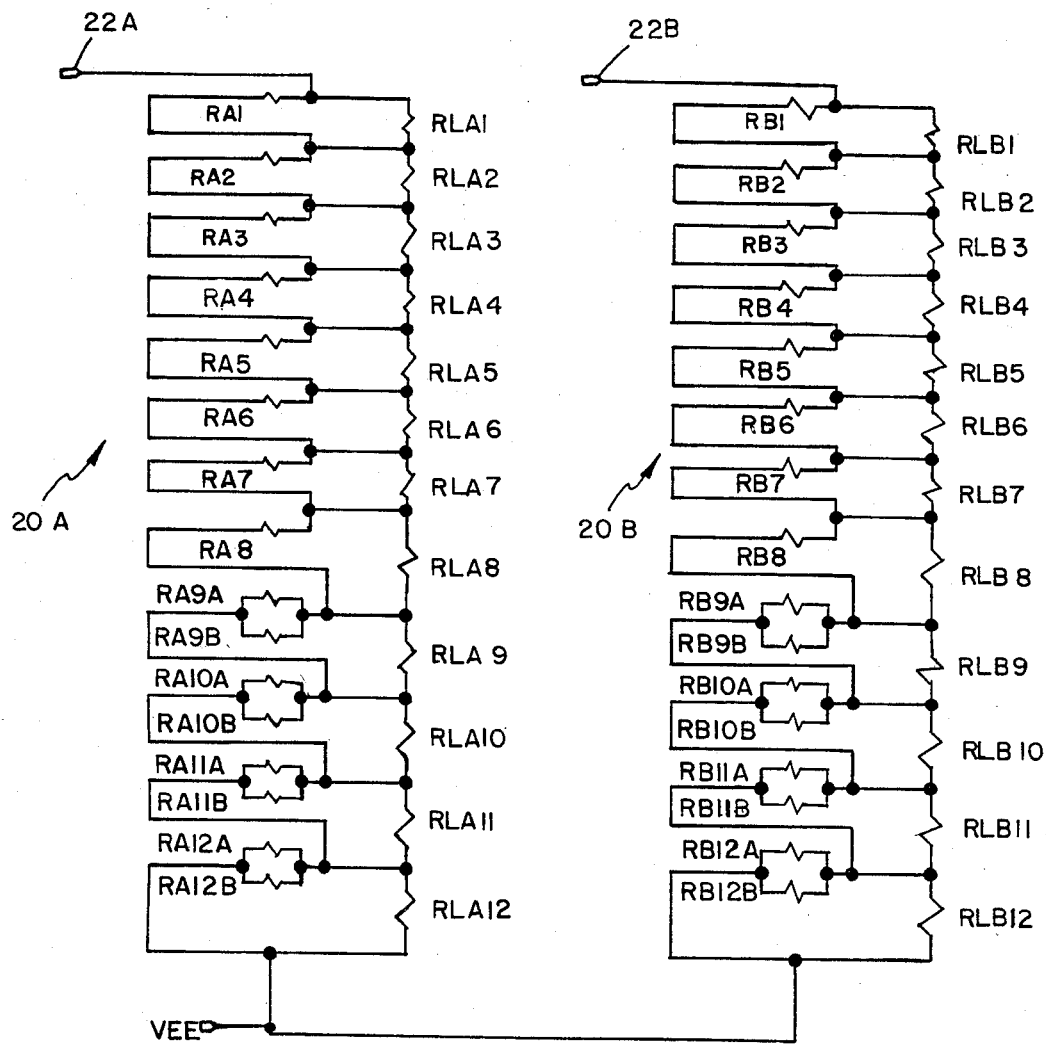
FIG. 2 is an electrical schematic diagram showing the input offset voltage trim resistor ladders used in the circuit of FIG. 1.

FIG. 2 shows trim resistor ladders 20A and 20B in more detail. Resistance ladder 20A includes twelve resistances connected in series between node 22A and negative rail VEE. The first eight resistances (RA1–RA8) are formed by single diffused resistors, while each of the remaining four resistances are formed by a pair of parallel diffused resistors RA9A and RA9B; RA10A and RA10B; RA11A and RA11B; and RA12A and RA12B. Connected in parallel with each of the twelve resistances is a low resistance titanium tungsten (TiW) shorting link RLA1-RLA12.

Trim resistor ladder 20B is identical to trim resistor ladder 20A, and has twelve resistances connected in series between node 22B and rail VEE. The first eight resistances (RB1-RB8) of ladder 20B are formed by individual diffused resistors. The remaining four resistances are each formed by a pair of diffused resistors in parallel: RB9A and RB9B; RB10A and RB10B, RB11A and RB11B, and RB12A and RB12B. Twelve TiW shorting links RLB1-RLB12 are connected in parallel with the respective twelve resistances of ladder 20B.

The resistances of trim resistor ladders 20A and 20B are weighted, so that they provide varying degrees of VOS trim, depending on which link or links are cut. Table 1 shows the resistances of resistors RA1-RA12B, RLA1-RLA12, RB1-RB12B, and RLB1-RLB12.

TABLE 1

| Resistance | Ohms |
| --- | --- |
| RA1, RB1 | 11646 |
| RA2, RB2 | 15083 |
| RA3, RB3 | 16542 |
| RA4, RB4 | 15292 |
| RA5, RB5 | 12063 |
| RA6, RB6 | 8313 |
| RA7, RB7 | 5292 |
| RA8, RB8 | 3166 |
| RA9A, RB9A | 3625 |
| RA9B, RB9B | 3729.2 |
| RA10A, RB10A | 3184 |
| RA10B, RB10B | 1684 |
| RA11A, RB11A | 1187.5 |
| RA11B, RB11B | 1239.8 |
| RA12A, RB12A | 1465.9 |
| RA12B, RB12B | 469.7 |
| RLA1-RLA12 | 41.4 |
| RLB1-RLB12 | 41.4 |

The method for trimming amplifier circuit 10 so that input offset voltage VOS is reduced is basically a "measure and trim" technique. The trimming takes place in two phases—a first phase in which comparable or corresponding links in each resistor ladder 20A and 20B are trimmed, and a second phase in which only links in one of the two ladders 20A and 20B are cut. In preferred embodiments of the present invention, the determination of which links are cut is based upon measurements of the offset voltage VOS before and after cutting links, together with numerical comparisons of input offset voltage VOS to calculated or stored values associated with the particular links to be cut. In preferred embodiments of the present invention, the calculating and comparing of numerical values is performed with a digital computer.

When starting the trimming process, a measurement is made to determine the magnitude and sign of the offset voltage VOS. The trimming range in a preferred embodiment of the present invention is ±3 mv. If the initial value of the input offset voltage VOS is outside of the trimming range, integrated circuit amplifier 10 is rejected at that point since it cannot be trimmed to within the desired specification.

During phase 1, comparable links on both sides (i.e. both ladders 20A and 20B) will be cut until it is determined that the next adjustment resistance to be connected into the circuit (by cutting a link) is going to provide enough adjustment so that it is only necessary to cut links on one of the two ladders 20A, 20B.

In the preferred embodiment shown in FIG. 2, there are twelve links in each resistor ladder, RLA1-RLA12 and RLB1-RLB12. In phase 1, n links (where n is an integer between 1 and 12) will be cut in both sides. The reason for this step is to narrow the trimming range so that in phase 2 only a small change of total resistance in one of the two ladders will produce a large amount of offset adjustment. This helps in reducing the resistor values, the number of resistors, and the number of cut links necessary in order to provide trimming over a large trimming range.

During phase 1, the absolute value of the offset voltage VOS is compared to an adjustment value Av(n) which is related to the particular link n to be cut. Values Av(n) are precalculated and stored in an array. The trim algorithm performed compares the absolute value of VOS to Av(n) on a link-by-link basis from n=1 through n=12 until a value of n is found where the absolute value of VOS is less than Av(n). In phase 1, all of the links up to link n are also cut on both ladders 20A and 20B. After phase 1, the initial input offset voltage remains unchanged. As stated above, the purpose of phase 1 is to narrow the trimming range in preparation for phase 2.

In phase 2, only a link or links in one of the two ladders 20A, 20B is cut depending on the polarity of the offset voltage and the calculated expected adjustment (CEA). The CEA is calculated by the computer as follows:

Suppose n links are cut during phase 1, then RT=Rtotal=(Rinitial+R1+ ... +Rn).

$$I=IA=IB=0.65 \text{ v} / RT.$$

$$V=0.6+0.0257*\ln(120E-6/I)$$

$$I=V/RT$$

Suppose VOS is positive, then resistor ladder RLA(n) will be cut.

We have IB=I (above), calculate CEA if RLA (n+1) is cut.

$$IA=IA(n+1)=0.65 \text{ v}/[RT+R(n+1)]$$

$$V=0.6+0.0257*\ln(120E-6/IA)$$

$$IA=V/[RT+R(n+1)]$$

Then, $$CEA=0.0257*\ln[(240E-6+IB-IA)/(240E-6-IB+IA)], \text{ for } IB>IA$$

Now, if CEA<VOS−10 uv then cut the link RLA(n+1), otherwise no link is cut, and link (n+2) is checked.

After a link is cut, RT is recalculated and VOS is remeasured.

The trim algorithm is described in further detail in Table 2.

TABLE 2

Flow Chart:
    Precalculated data stored in arrays
Av[n] array
    Dimension Av[12]
    Av[1] = 0.0014
    For J = 1 to 11
        Av[J+1] = Av[J] * 0.55
    Next J
Resistor ladder RA[n] array
    Dimension RA [12]

TABLE 2-continued

```
                    RA [1]  = 11646
                    RA [2]  = 15083
                    RA [3]  = 16542
                    RA [4]  = 15292
                    RA [5]  = 12063
                    RA [6]  = 8313
                    RA [7]  = 5292
                    RA [8]  = 3166
                    RA [9]  = 1838
                    RA [10] = 637
                    RA [11] = 303
                    RA [12] = 141
Resistor ladder RB[n] array
                    Dimension RA(12)
                    RB [1]  = 11646
                    RB [2]  = 15083
                    RB [3]  = 16542
                    RB [4]  = 15292
                    RB [5]  = 12063
                    RB [6]  = 8313
                    RB [7]  = 5292
                    RB [8]  = 3166
                    RB [9]  = 1838
                    RB [10] = 637
                    RB [11] = 303
                    RB [12] = 141
Main program starts here
                    Set RTA = 39627
                    Set RTB = 39627
                    Set COUNT = 1
Loop 1 begins
                    For J = 1 to 12
                        Measure Vos
                        If abs(Vos) < 10uv or abs(Vos) > 3 mv then
                            exit , stop trim
                        Elseif abs(Vos) > Av[COUNT] then
                            exit loop 1
                        End if
                        Trim RLA[COUNT]
                        Trim RLB[COUNT]
                            RTA = RTA + RA[COUNT] − 80
                            RTB = RTB + RB[COUNT] − 80
                            COUNT = COUNT + 1
                    Next J
Loop 1 ends
                    I = 0.65 / RTA # calculate current in two ladder#
                    V = 0.6 + 0.0257 * ln ( 120E-6 / I )
                    I = V / RAT
                    IA = I
                    IB = I
Loop 2 begins
                    If Vos > 0 then
                        jump to subroutine 1
                    Else
                        jump to subroutine 2
                    End if
Loop 2 ends
Main program ends
      Subroutine 1
                    # Vos > 0 , we trim RLA[n] resistor ladder #
            For J = 1 to 12
                Measure Vos
                If Vos < −10 uv then
                    exit , stop trim
                End if
                RAT = RAT + RA[COUNT] − 80 #calculate expected adjustment #
                IA = 0.65 / RAT
                V = 0.6 + 0.0257 * ln ( 120e-6 / IA )
                IA = V / RAT
                EA = 0.0257 * ln { (240E-6 −IB + IA) / (240E-6 +IB − IA)}
                If EA < Vos −10uv then
                    trim RLA[COUNT]
                End if
                COUNT = COUNT + 1
            Next J
      Subroutine 2
                    # Vos < 0 , we trim RLB[n] resistor ladder #
            For J = 1 to 12
                Measure Vos
                If Vos < −10 uv then
                    exit , stop trim
                End if
```

TABLE 2-continued

```
RBT = RBT + RB[COUNT] — 80 #calculate expected adjustment #
IB = 0.65 / RBT
V = 0.6 + 0.0257 * ln ( 120e-6 / IB )
IB = V / RBT
EA = 0.0257 * ln { (240E-6 —IA + IB) / (240E-6 +IA — IB)}
If EA < Vos —10uv then
    trim RLB[COUNT]
End if
COUNT = COUNT + 1
Next J
```

Using the input offset voltage trimming method of the present invention, the initial ±3 mv offset voltage can be trimmed down to less than 25 microvolts. This is accomplished using only 200K total resistance, which is far less than the total resistance values required in prior art input offset voltage trimming schemes which cover a much smaller trimming range. As a result, the total chip area consumed for input offset voltage trimming is much less using the present invention.

By trimming links instead of resistors, drift of VOS over temperature and time is minimized. This is a significant advantage over prior art input offset voltage trimming techniques in which portions of resistors are actually cut using laser trimming.

Although the present invention has been described with reference to preferred embodiments, workers skilled in the art will recognize that changes may be made in form and detail without departing from the spirit and scope of the invention.

What is claimed is:

1. A method of reducing input offset voltage in an amplifier having a differential amplifier input stage, the method comprising:
   providing first and second current adjusting circuits connected to the differential amplifier for adjusting magnitudes of output currents of the differential amplifier, the first and second current adjusting circuits including first and second resistance networks, respectively; the first and second resistance networks each including a plurality of resistances connected in series, with a shorting link connected in parallel with each resistance;
   measuring input offset voltage (VOS) of the amplifier;
   comparing measured VOS with adjustment values associated with the individual shorting links to select which corresponding links in both resistance networks should be cut;
   cutting the corresponding links which are selected;
   selecting, based upon sign of measured VOS, the network in which at least one additional link will be cut;
   selecting, based upon measured VOS and the links already cut, at least one additional link to be cut in the network which is selected; and
   cutting the additional link selected.

2. The method of claim 1 wherein providing the first and second current adjusting circuits includes providing first and second resistance networks comprising a plurality of resistances having different weighted values.

3. The method of claim 2 wherein providing the first and second current adjusting circuits includes providing first and second resistance networks comprising diffused resistors.

4. The method of claim 3 wherein providing first and second current adjusting circuits includes providing shorting links comprising titanium tungsten film links.

5. An input offset voltage trimming circuit for reducing input offset voltage in a differential amplifier including first and second differential amplifier transistors having first and second terminals defining main current flow paths and control terminals coupled to a pair of inputs for providing first and second output currents through the main current flow paths whose relative magnitudes vary based upon voltages at the inputs; the circuit comprising:
   current source means for generating a source current;
   a current mirror including first and second current mirror transistors having control terminals connected to the current source means and first and second terminals defining main current flow paths coupled to the main current flow paths of the first and second differential amplifier transistors, respectively, for providing first and second adjustment currents through their main current flow paths to balance the respective first and second output currents when voltages at the pair of inputs are equal; and
   first and second resistance ladder networks connected in series with the first and second main current flow paths, respectively, of the first and second current mirror transistors for determining magnitudes of the first and second adjustment currents based upon total resistance of the first and second networks; the first and second networks each including a plurality of resistances connected in series, with a shorting link connected in parallel with each of the plurality of resistance.

6. The circuit of claim 5 wherein the plurality of resistances have different weighted values.

7. The circuit of claim 6 wherein the resistances are formed by diffused resistors.

8. The circuit of claim 5 wherein the links are titanium tungsten links.

* * * * *